United States Patent
Tanabe et al.

(10) Patent No.: US 10,941,493 B2
(45) Date of Patent: Mar. 9, 2021

(54) FILM FORMATION METHOD

(71) Applicant: C. Uyemura & Co., Ltd., Osaka (JP)

(72) Inventors: Katsuhisa Tanabe, Osaka (JP); Tatsushi Someya, Osaka (JP); Naoshi Nishimura, Osaka (JP); Tetsuya Sasamura, Osaka (JP); Eriko Furuya, Osaka (JP)

(73) Assignee: C. Uyemura & Co., Ltd., Osaka (JP)

( * ) Notice: Subject to any disclaimer, the term of this patent is extended or adjusted under 35 U.S.C. 154(b) by 0 days.

(21) Appl. No.: 16/307,418

(22) PCT Filed: Apr. 27, 2017

(86) PCT No.: PCT/JP2017/016793
§ 371 (c)(1),
(2) Date: Dec. 5, 2018

(87) PCT Pub. No.: WO2017/217125
PCT Pub. Date: Dec. 21, 2017

(65) Prior Publication Data
US 2019/0345612 A1 Nov. 14, 2019

(30) Foreign Application Priority Data
Jun. 13, 2016 (JP) .............................. JP2016-116993

(51) Int. Cl.
| | | |
|---|---|---|
| C23C 18/44 | (2006.01) | |
| C23C 18/16 | (2006.01) | |
| C23C 18/18 | (2006.01) | |
| C23C 18/54 | (2006.01) | |
| H01L 21/288 | (2006.01) | |

(52) U.S. Cl.
CPC .......... *C23C 18/44* (2013.01); *C23C 18/1651* (2013.01); *C23C 18/1831* (2013.01); *C23C 18/54* (2013.01); *H01L 21/288* (2013.01)

(58) Field of Classification Search
CPC ... C23C 18/16; C23C 18/18; C23C 18/20–54; C23C 18/44; C23C 18/1651; C23C 18/54; C23C 18/1831; C23C 18/1637; H01L 21/288
USPC ..... 427/97.9, 99.5, 304, 305, 306, 437, 438, 427/443.1
See application file for complete search history.

(56) References Cited

U.S. PATENT DOCUMENTS

| | | | |
|---|---|---|---|
| 6,398,856 | B1 | 6/2002 | Nakazawa |
| 2004/0013601 | A1* | 1/2004 | Butz ................. B01J 23/42 423/584 |
| 2007/0104929 | A1 | 5/2007 | Yim et al. |
| 2008/0138506 | A1 | 6/2008 | Kiso et al. |
| 2008/0138507 | A1 | 6/2008 | Kiso et al. |
| 2012/0186852 | A1 | 7/2012 | Lin et al. |
| 2013/0056247 | A1* | 3/2013 | Yoshioka ........... H01L 21/4832 174/251 |
| 2013/0130059 | A1 | 5/2013 | Yoshida et al. |
| 2014/0087205 | A1* | 3/2014 | Pang ................. H01L 24/00 428/601 |

FOREIGN PATENT DOCUMENTS

| | | |
|---|---|---|
| CN | 1255212 C | 1/2004 |
| CN | 102893711 A | 1/2021 |
| JP | S54-117329 A | 9/1979 |
| JP | H05-327187 A | 12/1993 |
| JP | H09-008438 A | 1/1997 |
| JP | 2001-107259 A | 4/2001 |
| JP | 2004-039995 A | 2/2004 |
| JP | 2004-137589 A | 5/2004 |
| JP | 2005-054267 A | 3/2005 |
| JP | 2005-317729 A | 11/2005 |
| JP | 2007-123883 A | 5/2007 |
| JP | 2008-144188 A | 6/2008 |
| JP | 2008-184679 A | 8/2008 |
| JP | 2012-052156 A | 3/2012 |
| JP | 2013-108180 A | 6/2013 |
| KR | 2013-0056629 A | 5/2013 |
| WO | WO 2004/111287 A2 | 12/2004 |
| WO | WO 2010/004856 A1 | 1/2010 |

OTHER PUBLICATIONS

European Patent Office, Extended European Search Report for European Patent Application No. 17813030.8, dated Apr. 4, 2019, 7 pages, France.
International Searching Authority, International Search Report (ISR) and Written Opinion for International Application No. PCT/JP2017/016793, dated Jun. 20, 2017, 9 pages, Japan Patent Office, Japan.
C Rao, et al., "*Chemical and electrochemical depositions of platinum group metals and their applications*" Coordination Chemistry Reviews, vol. 249, No. 5-6, Mar. 1, 2005, pp. 613-631.

* cited by examiner

*Primary Examiner* — Dah-Wei D. Yuan
*Assistant Examiner* — Nga Leung V Law
(74) *Attorney, Agent, or Firm* — Alston & Bird LLP

(57) ABSTRACT

A film formation method is provided with a catalyst film formation step for forming a catalyst film on the surface of a substrate by displacement reduction plating, an intermediate film formation step for forming a palladium plating film on the catalyst film, and a surface film formation step for forming a gold plating film on the palladium plating film.

5 Claims, No Drawings

FILM FORMATION METHOD

CROSS REFERENCE TO RELATED APPLICATIONS

This application is a national stage application, filed under 35 U.S.C. § 371, of International Application No. PCT/JP2017/016793, filed Apr. 27, 2017, which claims priority to Japanese Application No. 2016-116993, filed Jun. 13, 2016, the contents of both of which as are hereby incorporated by reference in their entirety.

BACKGROUND

Technical Field

The present disclosure relates to a film formation method, in particular, relates to a method for forming a film on, for example, a conductor circuit.

Description of Related Art

Common semiconductor devices include a copper conductor circuit. To almost all conductor circuits, solder bonding or wire bonding is applied. However, copper is a material whose surface easily oxidizes, and is therefore unsuitable for solder bonding and wire bonding. Therefore, a plating film has been formed on a surface of a conductor circuit, and solder bonding or wire bonding has been applied to the film. As the film to be formed on a surface of a conductor circuit, a three-layer film (an electroless nickel electroless palladium immersion gold (ENEPIG) film) comprising nickel, palladium, and gold is known.

A nickel film serving as the bottom layer of an ENEPIG film has a thickness of several micrometers. However, finer patterning of a conductor circuit has been desired, and a space between wires has been increasingly narrower. Hence, when a thick nickel film is formed, the risk of a short-circuit between conductor circuits is created. Therefore, an attempt to form a palladium film directly on a copper surface without providing a nickel film on the surface has been made (for example, see Japanese Unexamined Patent Publication No. 2005-317729). However, it is very difficult to form a palladium film directly on a copper surface.

Furthermore, a study has been made to provide a catalyst metal on a copper surface and thereby stably apply palladium plating (for example, see Pamphlet of WO 2010/004856 and Japanese Unexamined Patent Publication No. 2013-108180).

BRIEF SUMMARY

However, conventional methods cannot provide a catalyst metal uniformly on a copper surface. Accordingly, a palladium film is unevenly provided; copper serving as a base diffuses in the surface of the film; or palladium itself diffuses in the surface of the film. This causes deterioration in the solder bondability and the wire bondability of the film, thereby causing a loss of connection reliability.

It is an object of the present disclosure to form a film with high connection reliability on a surface of, for example, a conductor circuit.

An aspect of a film formation method according to the present disclosure comprises: a catalyst film formation step of forming a catalyst film on a surface of a substrate by substitution reduction plating; an intermediate film formation step of forming a palladium-plating film on the catalyst film; and a surface film formation step of forming a gold plating film on the palladium-plating film.

In one aspect of the film formation method, the catalyst film is a gold film or a platinum film.

In one aspect of the film formation method, the substrate includes a copper circuit.

The film formation method according to the present disclosure makes it possible to form a film with high connection reliability on a surface of, for example, a conductor circuit.

DETAILED DESCRIPTION OF VARIOUS EMBODIMENTS

The film formation method according to the present disclosure comprises a catalyst film formation step of forming a catalyst film on a surface of a substrate by substitution reduction plating, an intermediate film formation step of forming a palladium plating film on the catalyst film, and a surface film formation step of forming a gold plating film on the palladium plating film.

Unlike substitution plating, in substitution reduction plating, a reducing agent is contained in a plating bath. In substitution plating, by a substitution reaction between an object to be plated and a plating metal, the plating metal is deposited on a surface of the object to be plated. For example, in a case of forming a gold film on a surface of copper by substitution plating, the copper serving as a base is dissolved and thereby substituted with gold. Accordingly, the reaction proceeds in a region in which copper is more easily dissolved, whereas the reaction becomes slow in a region in which copper is less easily dissolved, and thus, the resultant film is likely to be un-uniform. A conductor circuit is, due to its shape and other factors, likely to have a region in which copper is more easily dissolved and a region in which copper is less easily dissolved. Thus, it is difficult to form a thin and uniform plating film by substitution plating. Furthermore, in substitution plating, when a thicker film is formed, the base is corroded.

By contrast, in substitution reduction plating, the same substitution reaction as that in substitution plating occurs at the initial stage, but, after the reaction, electrons are auto-catalytically released from a reducing agent, whereby the deposition of metal proceeds. This allows a film with much higher uniformity to be formed, compared to the case of reduction plating, and the base hardly suffers corrosion.

When a thin and uniform catalyst film is formed by substitution reduction plating, a palladium film to be formed subsequently is dense and uniform, accordingly. Thus, the function of the palladium film as a copper diffusion barrier is enhanced, and furthermore, the palladium film itself is less likely to diffuse. Thus, the diffusion of copper and palladium into a gold film on the top surface is substantially prevented, and the solder bondability and the wire bondability can be enhanced.

The catalyst film is only required to be formed uniformly on the surface of copper, serving as a substrate, by substitution reduction plating, and to have a catalytic activity of palladium plating. For example, the catalyst film may be a gold film or platinum film. The catalyst film is preferably platinum because platinum has a higher catalytic activity and allows the thickness of the film to be thinner. Furthermore, platinum is not easily solid-dissolved and expected to have a barrier property. From the viewpoint of ease of film formation, the catalyst film is preferably gold.

A catalyst film formation bath adopted to form the catalyst film is a substitution reduction plating bath, and includes a water-soluble metal compound, a chelating agent, and a reducing agent. The reducing agent may be selected in accordance with the type of metal to be formed into the catalyst film. In the case of forming a gold film as the catalyst film, for example, at least one of a mixture of an amine-based compound and at least one of formaldehyde or formaldehyde sodium bisulfite, hydrazine, ascorbic acid, or dimethylamineborane may be used. In the case of forming a platinum film as the catalyst film, for example, at least one of formic acid, hydrazine, ascorbic acid, or dimethylamineborane may be used. It should be noted that examples of the ascorbic acid and the formic acid include those in the form of a salt.

As the amine-based compound, a compound of the following Formula (1) or Formula (2) may be used.

$$R_1-NH-C_2H_4-NH-R_2 \quad (1)$$

$$R_3-(CH_2-NH-C_2H_4-NH-CH_2)_n-R_4 \quad (2)$$

where $R_1$, $R_2$, $R_3$, and $R_4$ in Formulas (1) and (2) are each —OH, —CH$_3$, —CH$_2$OH, —C$_2$H$_4$OH, —CH$_2$N(CH$_3$)$_2$, —CH$_2$NH(CH$_2$OH), —CH$_2$NH(C$_2$H$_4$OH), —C$_2$H$_4$NH (CH$_2$OH), —C$_2$H$_4$NH(C$_2$H$_4$OH), —CH$_2$N(CH$_2$OH)$_2$, —CH$_2$N(C$_2$H$_4$OH)$_2$, —C$_2$H$_4$N(CH$_2$OH)$_2$, or —C$_2$H$_4$N (C$_2$H$_4$OH)$_2$; all of $R_1$, $R_2$, $R_3$, and $R_4$ may be the same or at least some of $R_1$, $R_2$, $R_3$, and $R_4$ may be different; and n is an integer of 1 to 4.

Specific examples of the amine-based compound of Formula (1) include N,N'-bis(2-hydroxyethyl)ethylenediamine ((HOCH$_2$ CH$_2$)HNCH$_2$CH$_2$NH(CH$_2$CH$_2$OH)).

The concentration of the reducing agent in the catalyst film formation bath may be appropriately set in accordance with the type of metal to be formed into the catalyst film and the type of the reducing agent, but, in order to achieve a required plating deposition rate, the concentration is preferably 0.1 g/L or more, more preferably 0.5 g/L or more. Furthermore, from the viewpoint of stability of the plating bath, the concentration is preferably 10 g/L or less, more preferably 5 g/L or less.

The water-soluble metal compound may be selected in accordance with the type of metal to be formed into the catalyst film. For example, in the case of forming a gold film as the catalyst film, common metal salts of gold, such as gold cyanide salts, gold chloride salts, gold sulfite salts, and gold thiosulfate salts, may be used. In the case of forming a platinum film as the catalyst film, common metal salts of platinum, such as dinitrodiammineplatinum, chloroplatinates, tetraammine platinum salts, and hexaammine platinum salts, may be used. These metal compounds may be used singly, or two or more of them may be used in combination.

From the viewpoint of productivity, the concentration of each of metals constituting the metal compound in the catalyst film formation bath is preferably 0.1 g/L or more, more preferably 0.5 g/L or more. From the viewpoint of stability of the plating bath, the concentration is preferably 3 g/L or less, more preferably 2 g/L or less.

As the chelating agent, a common copper chelating agent may be used. Examples of the chelating agent include aminocarboxylic acid and polycarboxylic acid. Examples of the aminocarboxylic acid include glycine, ethylenediaminetetraacetic acid (EDTA), triethylenediaminetetraacetic acid, glutamic acid, and aspartic acid. Examples of the polycarboxylic acid include malonic acid, maleic acid, succinic acid, citric acid, and malic acid. Examples of the aminocarboxylic acid and the polycarboxylic acid include those in the form of a salt. These compounds may be used singly, or two or more of them may be used in combination.

The concentration of the chelating agent may be appropriately set in accordance with the type of metal to be formed into the catalyst film and the type of the chelating agent. For example, in the case of using tetrasodium ethylenediaminetetraacetate as the chelating agent to form a gold film or a platinum film, the concentration of the chelating agent in the catalyst film formation bath is, from the viewpoint of productivity, preferably 2 g/L or more, more preferably 4 g/L or more. From the viewpoint of stability, the concentration is preferably 30 g/L or less, more preferably 20 g/L or less.

Besides the above-mentioned compounds, the same components as those included in a common substitution plating bath may be added to the catalyst film formation bath. It should be noted that components other than a water-soluble metal compound, a chelating agent, and a reducing agent are options, and therefore such components may not be included.

The pH of the catalyst film formation bath may be appropriately set in accordance with the type of metal to be formed into the catalyst film and the type of the reducing agent. From the viewpoint of plating bath stability, the pH of the catalyst film formation bath is preferably 3 or higher. Furthermore, from the viewpoint of deposition rate, the pH of the catalyst film formation bath is preferably 10 or lower. In the case where hydrazine or dimethylamineborane is used as the reducing agent, a comparatively higher pH is more preferable from the viewpoint of deposition rate. In the case where a compound other than hydrazine or dimethylamineborane is used as the reducing agent, approximately a neutral pH (pH 7) is more preferable from the viewpoint of stability. For the adjustment of the pH, an acid or an alkali may be used. Alternatively, a solution having a buffering action may be used.

The operating temperature, plating time, and the like of the catalyst film formation bath are selected in accordance with a required thickness of the catalyst film. The operating temperature is preferably 10° C. or higher and preferably 95° C. or lower. The plating time is preferably 5 seconds or longer and preferably 15 minutes or shorter.

To form a uniform palladium film, the thickness of the catalyst film to be formed through the catalyst film formation bath is preferably 0.001 μm or more. Furthermore, from the viewpoint of productivity, the thickness is preferably 0.5 μm or less, more preferably 0.2 μm or less.

The substrate on which the catalyst film is formed may be made of copper or an alloy including copper as a main component. For example, the substrate may be a printed circuit board to which an electronic component is to be mounted, a board to which a semiconductor device is to be mounted, or a conductor circuit provided in, for example, an electronic component to be mounted. Alternatively, the substrate may be any conductor circuit to which solder bonding or wire bonding is to be applied.

As the intermediate film formation bath adopted to form a palladium plating film serving as the intermediate film on the catalyst film, a common palladium plating bath may be used. The palladium plating bath may be a reduction palladium plating bath including a reducing agent, or may be a substitution palladium plating bath not including a reducing agent. The use of the reduction palladium plating bath allows a more uniform palladium film to be formed, and also reduces, for example, corrosion of the catalyst film.

From the viewpoint of a barrier property, the thickness of the intermediate film is preferably 0.05 μm or more. From the viewpoint of productivity, the thickness is preferably 0.5 µm or less, more preferably 0.2 µm or less.

To enhance crystallinity and improve a barrier property, the intermediate film is preferably a pure palladium film not containing phosphorus. However, the intermediate film may be a palladium alloy film as long as a sufficient barrier property is achieved.

As a surface film formation bath adopted to form a gold plating film serving as the surface film on the intermediate film, a common gold plating bath may be used. The surface film plating bath may be a substitution reduction gold plating bath including a reducing agent, or may be a substitution gold plating bath not including a reducing agent. The use of the substitution reduction gold plating bath allows a more uniform gold plating film to be formed.

From the viewpoint of the solder bondability and the wire bondability, the thickness of the surface film is preferably 0.05 µm or more. From the viewpoint of productivity, the thickness is preferably 0.5 µm or less, more preferably 0.2 µm or less.

The three-layer film formed in accordance with the film formation method of the present embodiment is such that copper of the substrate and palladium of the intermediate film do not easily diffuse in the gold plating film serving as the surface film. Accordingly, the three-layer film is resistant to oxidizing, and solder wettability is improved, whereby the solder bondability is improved. Moreover, the bonding property of a golden wire is also good, and enhanced connection reliability is achieved.

EXAMPLE

Hereinafter, the present invention will be described in detail with reference to examples. It should be noted that the following examples are merely illustrative and the present invention is not limited to these examples.

<Substrate>

A substrate adopted to form a film thereon was produced by plating a copper-laminated plate (10 cm×10 cm with a thickness of 1.0 mm) with copper sulfate.

<Measurement of Film Thickness>

The thickness of a film was evaluated using an X-ray fluorescence spectroscopic analyser (SFT-9550, manufactured by Hitachi High-Technologies Corporation).

<Evaluation of Barrier Property>

The barrier property of a film was evaluated by heating a substrate on which the film had been formed at 175° C. for 16 hours, and thereafter measuring the elementary composition of a surface of the film. The elementary composition was evaluated by wide-scanning measurement using an Auger electron spectroscopy apparatus (JAMP-9500F, manufactured by JEOL Ltd.). The measurement was performed under the conditions of an accelerating voltage of 10 keV and an electric current value of $4 \times 10^{-8}$ A. A case in which copper and palladium were not detected in the surface of the film was evaluated to be good, whereas a case in which copper and palladium were detected in the surface of the film was evaluated to be poor.

<Evaluation of Solder Bondability>

Solder bondability was evaluated by ball pull testing at 20 points per condition. A film was formed on a substrate provided with a solder resist (SR) opening having a diameter of 0.5 mm, and subsequently, a 0.6-mm solder ball (Sn-3Ag-0.5Cu, SAC305) was mounted on the SR opening by using a reflow system (TMR-15-22LH, manufactured by TAMURA CORPORATION) under a heat-treatment condition of 240° C. (peak temperature), and a ball pull test was conducted using a bond tester (bond tester SERIES4000, manufactured by DAGE Precision Industries Ltd.) to evaluate a breakage mode of the film. A solder breakage percentage of 85% or higher was evaluated to be good, whereas a solder breakage percentage of less than 85% was evaluated to be poor. Evaluation conditions are collectively shown below.

[Measurement Conditions]

Measurement method: ball pull test Substrate: ball grid array (BGA) substrate, manufactured by C. Uyemura & Co., Ltd. (pad diameter: ɸ0.5 mm)

Solder ball: ɸ0.6 mm, Sn-3.0Ag-0.5Cu, manufactured by SENJU METAL INDUSTRY CO., LTD.

Reflow apparatus: TMR-15-22LH, manufactured by TAMURA CORPORATION

Reflow condition: peak temperature of 240° C.

Reflow environment: air

Number of times of reflow operation: 1 reflow operation and 5 reflow operations

Flux: 529D-1 (RMA type), manufactured by SENJU METAL INDUSTRY CO., LTD.

Test speed: 5000 µm/second

Aging after solder mounting: 1 hour

<Evaluation of Wire Bondability>

Wire bondability was evaluated by wire pull testing at 20 points per condition. A substrate on which a film had been formed was heated at 175° C. for 16 hours, and thereafter a gold wire having a diameter of 25 µm was bonded to the heated substrate using a semi-automatic wire bonder (HB16, manufactured by TPT). The wire was torn off in the vicinity of a second bonding portion, and the pull strength of the wire was measured using a wire pull apparatus (bond tester SERIES4000, manufactured by DAGE Precision Industries Ltd). A pull strength of 8 g or more was evaluated to be good, whereas a pull strength of less than 8 g was evaluated to be poor. Evaluation conditions are collectively shown below.

[Measurement Conditions]

Bonding Capillary: B1014-51-18-12 (PECO)

Wire: 1 Mil-Gold

Stage temperature: 150° C.

Supersonic wave (mW): 250 (first), 250 (second)

Bonding duration (millisecond): 200 (first), 50 (second)

Pull force (gf): 25 (first), 50 (second).

Step (length from the first to the second): 0.700 mm

Measurement method: wire pull testing

Substrate: BGA substrate, manufactured by C. Uyemura & Co., Ltd.

Test speed: 170 µm/second

<Catalyst Film Formation Bath>

Substitution reduction gold (Au) plating baths 1 to 6, substitution reduction platinum (Pt) plating baths 1 to 4, a substitution reduction palladium (Pd) plating bath, a substitution gold (Au) plating bath, a substitution platinum (Pt) plating bath, and a substitution palladium (Pd) plating bath were used. Table 1 shows the compositions of the plating baths. It should be noted that the concentration of a metal compound denotes the concentration of metals included in a bath. As an amine compound, N,N'-bis(2-hydroxyethyl) ethylenediamine was used.

TABLE 1

| | Metal Compound | | Chelating Agent | | Reducing Agent | | |
|---|---|---|---|---|---|---|---|
| | Type | Conc. | Type | Conc. | Type | Conc. | pH |
| Substitution Reduction Au Plating Bath 1 | Potassium Dicyanoaurate | 1 g/L | EDTA | 10 g/L | Formaldehyde Amine Compound | 1 g/L | 7 |
| Substitution Reduction Au Plating Bath 2 | Potassium Dicyanoaurate | 1 g/L | EDTA | 10 g/L | Formaldehyde Sodium Bisulfite Amine Compound | 1 g/L | 7 |
| Substitution Reduction Au Plating Bath 3 | Potassium Dicyanoaurate | 1 g/L | EDTA | 10 g/L | Formaldehyde Formaldehyde Sodium Bisulfite Amine Compound | 1 g/L | 7 |
| Substitution Reduction Au Plating Bath 4 | Potassium Dicyanoaurate | 1 g/L | EDTA | 10 g/L | Hydrazine | 1 g/L | 9 |
| Substitution Reduction Au Plating Bath 5 | Potassium Dicyanoaurate | 1 g/L | EDTA | 10 g/L | Ascorbic Acid | 1 g/L | 7 |
| Substitution Reduction Au Plating Bath 6 | Potassium Dicyanoaurate | 1 g/L | EDTA | 10 g/L | Dimethylamine borane | 1 g/L | 9 |
| Substitution Reduction Pt Plating Bath 1 | Dinitrodiammine platinum | 1 g/L | EDTA | 10 g/L | Formic Acid | 1 g/L | 7 |
| Substitution Reduction Pt Plating Bath 2 | Dinitrodiammine platinum | 1 g/L | EDTA | 10 g/L | Hydrazine | 1 g/L | 9 |
| Substitution Reduction Pt Plating Bath 3 | Dinitrodiammine platinum | 1 g/L | EDTA | 10 g/L | Ascorbic Acid | 1 g/L | 7 |
| Substitution Reduction Pt Plating Bath 4 | Dinitrodiammine platinum | 1 g/L | EDTA | 10 g/L | Dimethylamine borane | 1 g/L | 9 |
| Substitution Au Plating Bath | Potassium Dicyanoaurate | 1 g/L | EDTA | 10 g/L | Not Contained | 1 g/L | 7 |
| Substitution Pt Plating Bath | Dinitrodiammine platinum | 1 g/L | EDTA | 10 g/L | Not Contained | 1 g/L | 7 |

<Intermediate Film Formation Bath>

A commercially available electroless palladium plating solution (ALTAREA™ TPD-21, manufactured by C. Uyemura & Co., Ltd.) was used.

<Surface Film Formation Bath>

A commercially available electroless gold plating solution (GOBRIGHT™ TWX-40, manufactured by C. Uyemura & Co., Ltd.) was used.

Example 1

Prior to the formation of a film, a substrate was subject to degreasing, soft etching, and pickling. The degreasing was performed at 50° C. for 5 minutes by using a commercially available cleaning liquid (ACL-007, manufactured by C. Uyemura & Co., Ltd). The soft etching was performed at 30° C. for 1 minute by using a 100 g/L sodium persulfate solution. The pickling was performed at room temperature for 1 minute by using a 10% sulfuric acid.

Using the substitution reduction gold plating bath 1 as the catalyst film formation bath, a gold catalyst film was formed. The temperature of the catalyst film formation bath was 80° C., and plating time was 2 minutes. Subsequently, an palladium intermediate film was formed using the intermediate film formation bath. The temperature of the intermediate film formation bath was 55° C., and plating time was 5 minutes. Subsequently, a gold surface film was formed using the surface film formation bath. The temperature of the surface film formation bath was 78° C., and plating time was 10 minutes.

The obtained catalyst film had a film thickness of 0.01 μm. The obtained intermediate film had a film thickness of 0.1 μm. The obtained surface film had a film thickness of 0.1 μm.

Copper and palladium were not detected in the surface of a resultant film, and thus the film had a good barrier property. Furthermore, the resultant film had good solder bondability and good wire bondability.

Example 2

A film was formed in the same manner as in Example 1, except that the substitution reduction gold plating bath 2 was used as the catalyst film formation bath.

The obtained catalyst film had a film thickness of 0.01 μm. The obtained intermediate film had a film thickness of 0.1 μm. The obtained surface film had a film thickness of 0.1 μm.

Copper and palladium were not detected in the surface of a resultant film, and hence the film had a good barrier property. Furthermore, the resultant film had good solder bondability and good wire bondability.

Example 3

A film was formed in the same manner as in Example 1, except that the substitution reduction gold plating bath 3 was used as the catalyst film formation bath.

The obtained catalyst film had a film thickness of 0.01 μm. The obtained intermediate film had a film thickness of 0.1 μm. The obtained surface film had a film thickness of 0.1 μm.

Copper and palladium were not detected in the surface of a resultant film, and hence the film had a good barrier property. Furthermore, the resultant film had good solder bondability and good wire bondability.

Example 4

A film was formed in the same manner as in Example 1, except that the substitution reduction gold plating bath 4 was used as the catalyst film formation bath.

The obtained catalyst film had a film thickness of 0.01 μm. The obtained intermediate film had a film thickness of 0.1 μm. The obtained surface film had a film thickness of 0.1 μm.

Copper and palladium were not detected in the surface of a resultant film, and hence the film had a good barrier property. Furthermore, the resultant film had good solder bondability and good wire bondability.

Example 5

A film was formed in the same manner as in Example 1, except that the substitution reduction gold plating bath 5 was used as the catalyst film formation bath.

The obtained catalyst film had a film thickness of 0.01 μm. The obtained intermediate film had a film thickness of 0.1 μm. The obtained surface film had a film thickness of 0.1 μm.

Copper and palladium were not detected in the surface of a resultant film, and hence the film had a good barrier property. Furthermore, the resultant film had good solder bondability and good wire bondability.

Example 6

A film was formed in the same manner as in Example 1, except that the substitution reduction gold plating bath 6 was used as the catalyst film formation bath.

The obtained catalyst film had a film thickness of 0.01 μm. The obtained intermediate film had a film thickness of 0.1 μm. The obtained surface film had a film thickness of 0.1 μm.

Copper and palladium were not detected in the surface of a resultant film, and hence the film had a good barrier property. Furthermore, the resultant film had good solder bondability and good wire bondability.

Example 7

Using the substitution reduction platinum plating bath 1 as the catalyst film formation bath, a platinum catalyst film was formed. The temperature of the catalyst film formation bath was 50° C., and plating time was 2 minutes. An intermediate film and a surface film were formed in the same manner as in Example 1.

The obtained catalyst film had a film thickness of 0.01 μm. The obtained intermediate film had a film thickness of 0.1 μm. The obtained surface film had a film thickness of 0.1 μm.

Copper and palladium were not detected in the surface of a resultant film, and hence the film had a good barrier property. Furthermore, the resultant film had good solder bondability and good wire bondability.

Example 8

A film was formed in the same manner as in Example 7, except that the substitution reduction platinum plating bath 2 was used as the catalyst film formation bath.

The obtained catalyst film had a film thickness of 0.01 μm. The obtained intermediate film had a film thickness of 0.1 μm. The obtained surface film had a film thickness of 0.1 μm.

Copper and palladium were not detected in the surface of a resultant film, and hence the film had a good barrier property. Furthermore, the resultant film had good solder bondability and good wire bondability.

Example 9

A film was formed in the same manner as in Example 7, except that the substitution reduction platinum plating bath 3 was used as the catalyst film formation bath.

The obtained catalyst film had a film thickness of 0.01 μm. The obtained intermediate film had a film thickness of 0.1 μm. The obtained surface film had a film thickness of 0.1 μm.

Copper and palladium were not detected in the surface of a resultant film, and hence the film had a good barrier property. Furthermore, the resultant film had good solder bondability and good wire bondability.

Example 10

A film was formed in the same manner as in Example 7, except that the substitution reduction platinum plating bath 4 was used as the catalyst film formation bath.

The obtained catalyst film had a film thickness of 0.01 μm. The obtained intermediate film had a film thickness of 0.1 μm. The obtained surface film had a film thickness of 0.1 μm.

Copper and palladium were not detected in the surface of a resultant film, and hence the film had a good barrier property. Furthermore, the resultant film had good solder bondability and good wire bondability.

Comparative Example 1

A film was formed in the same manner as in Example 1, except that the substitution gold plating bath was used as the catalyst film formation bath.

The obtained catalyst film had a film thickness of 0.01 μm. The obtained intermediate film had a film thickness of 0.1 μm. The obtained surface film had a film thickness of 0.1 μm.

Copper and palladium were detected in the surface of a resultant film. Furthermore, the resultant film had poor solder bondability and poor wire bondability.

Comparative Example 2

A film was formed in the same manner as in Example 7, except that the substitution platinum plating bath was used as the catalyst film formation bath.

The obtained catalyst film had a film thickness of 0.01 μm. The obtained intermediate film had a film thickness of 0.1 μm. The obtained surface film had a film thickness of 0.1 μm.

Copper and palladium were detected in the surface of a resultant film. Furthermore, the resultant film had poor solder bondability and poor wire bondability.

Tables 2 to 4 collectively show the film formation conditions and the evaluation results of each of the examples and the comparative examples. As shown in Tables 2 to 4, it was observed that the catalyst films formed by substitution reduction plating had good solder bondability and good wire bondability.

TABLE 4

|  | Comparative Example 1 | Comparative Example 2 |
|---|---|---|
| Catalyst Film Formation Bath | Substitution Au Plating Bath | Substitution Pt Plating Bath |
| Intermediate Film Formation Bath | Reduction Pd Plating Bath | Reduction Pd Plating Bath |
| Surface Film Formation Bath | Substitution Reduction Au Plating Bath | Substitution Reduction Au Plating Bath |
| Barrier Property | Poor | Poor |
| Solder Bondability | Poor | Poor |
| Wire Bondability | Poor | Poor |

The film formation method according to the present disclosure is capable of forming a film with high connection reliability, and is thus useful as a method for forming a film on a surface of, for example, a conductor circuit.

The invention claimed is:

1. A film formation method, said method comprising the steps of:
   forming a catalyst film on a surface of a substrate by substitution reduction plating;
   forming a palladium plating film as an intermediate film on the catalyst film; and

TABLE 2

|  | Example 1 | Example 2 | Example 3 | Example 4 | Example 5 | Example 6 |
|---|---|---|---|---|---|---|
| Catalyst Film Formation Bath | Substitution Reduction Au Plating Bath 1 | Substitution Reduction Au Plating Bath 2 | Substitution Reduction Au Plating Bath 3 | Substitution Reduction Au Plating Bath 4 | Substitution Reduction Au Plating Bath 5 | Substitution Reduction Au Plating Bath 6 |
| Intermediate Film Formation Bath | Reduction Pd Plating Bath | Reduction Pd Plating Bath | Reduction Pd Plating Bath | Reduction Pd Plating Bath | Reduction Pd Plating Bath | Reduction Pd Plating Bath |
| Surface Film Formation Bath | Substitution Reduction Au Plating Bath | Substitution Reduction Au Plating Bath | Substitution Reduction Au Plating Bath | Substitution Reduction Au Plating Bath | Substitution Reduction Au Plating Bath | Substitution Reduction Au Plating Bath |
| Barrier Property | Good | Good | Good | Good | Good | Good |
| Solder Bondability | Good | Good | Good | Good | Good | Good |
| Wire Bondability | Good | Good | Good | Good | Good | Good |

TABLE 3

|  | Example 7 | Example 8 | Example 9 | Example 10 |
|---|---|---|---|---|
| Catalyst Film Formation Bath | Substitution Reduction Pt Plating Bath 1 | Substitution Reduction Pt Plating Bath 2 | Substitution Reduction Pt Plating Bath 3 | Substitution Reduction Pt Plating Bath 4 |
| Intermediate Film Formation Bath | Reduction Pd Plating Bath | Reduction Pd Plating Bath | Reduction Pd Plating Bath | Reduction Pd Plating Bath |
| Surface Film Formation Bath | Substitution Reduction Au Plating Bath | Substitution Reduction Au Plating Bath | Substitution Reduction Au Plating Bath | Substitution Reduction Au Plating Bath |
| Barrier Property | Good | Good | Good | Good |
| Solder Bondability | Good | Good | Good | Good |
| Wire Bondability | Good | Good | Good | Good | forming a gold plating film as a surface film on the palladium plating film, wherein the catalyst film is a platinum film.

2. The film formation method of claim 1, wherein the substrate includes a copper circuit.

3. The film formation method of claim 1, wherein the step of forming the catalyst film is conducted by using a substitution reduction plating bath including a water-soluble metal compound, a chelating agent, and a reducing agent.

4. The film formation method of claim 3, wherein:
the water-soluble metal compound is at least one of dinitrodiammineplatinum, chloroplatinates, tetraammine platinum salts, or hexaammine platinum salts, and
the reducing agent is at least one of formic acid, hydrazine, ascorbic acid, or dimethylamineborane.

5. The film formation method of claim 1, wherein the palladium plating film is a pure palladium film not including phosphorus.

* * * * *